US012766664B2

(12) United States Patent
Yen et al.

(10) Patent No.: US 12,766,664 B2
(45) Date of Patent: Oct. 20, 2026

(54) POLISH APPARATUS AND METHODS FOR USE

(71) Applicant: Taiwan Semiconductor Manufacturing Co., Ltd., Hsinchu (TW)

(72) Inventors: Chia-Hsiang Yen, Chiayi County (TW); Peng-Chung Jangjian, Zhudong Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 429 days.

(21) Appl. No.: 18/318,075

(22) Filed: May 16, 2023

(65) Prior Publication Data

US 2024/0383096 A1 Nov. 21, 2024

(51) Int. Cl.

| | |
|---|---|
| ***B24B 37/24*** | (2012.01) |
| ***B24B 37/005*** | (2012.01) |
| ***B24B 53/017*** | (2012.01) |
| ***B24B 53/12*** | (2006.01) |
| *C09G 1/02* | (2006.01) |
| *C09K 3/14* | (2006.01) |
| *H10P 52/40* | (2026.01) |

(52) U.S. Cl.

CPC .......... *B24B 37/24* (2013.01); *B24B 37/0056* (2013.01); *B24B 53/017* (2013.01); *B24B 53/12* (2013.01); *C09G 1/02* (2013.01); *C09K 3/1463* (2013.01); *H10P 52/403* (2026.01)

(58) Field of Classification Search

CPC ... B24B 37/24; B24B 37/0056; B24B 53/017; B24B 53/12; C09G 1/02; C09K 3/1463; H10P 52/403

See application file for complete search history.

(56) References Cited

U.S. PATENT DOCUMENTS

| | | | | |
|---|---|---|---|---|
| 6,679,761 | B1 | 1/2004 | Sunahara et al. | |
| 8,053,521 | B2 * | 11/2011 | Okamoto .............. | H10P 95/062 451/526 |
| 2002/0010232 | A1 * | 1/2002 | Ogawa .................. | C08L 101/00 523/448 |

(Continued)

FOREIGN PATENT DOCUMENTS

| | | | |
|---|---|---|---|
| CN | 1569398 | A | 1/2005 |
| CN | 103128649 | A | 6/2013 |

(Continued)

OTHER PUBLICATIONS

JP-2003-003156 A, Fujii Shigeo et al "Clogging preventing agent composition of polishing pad" English machine translation, Jan. 8, 2003. (Year: 2003).*

(Continued)

*Primary Examiner* — Anita K Alanko

(74) *Attorney, Agent, or Firm* — Slater Matsil, LLP

(57) ABSTRACT

A chemical mechanical polish apparatus and methods for manufacturing and use of the chemical mechanical polishing apparatus are discussed herein. In an embodiment, a polishing apparatus is provided that includes: a polishing pad coated with polypeptides; and an enzyme spraying device positioned adjacent to the polishing pad.

20 Claims, 7 Drawing Sheets

(56) References Cited

U.S. PATENT DOCUMENTS

| | | | | |
|---|---|---|---|---|
| 2003/0004085 | A1* | 1/2003 | Ando | C11D 7/3209 510/438 |
| 2004/0224611 | A1 | 11/2004 | Aoi et al. | |
| 2009/0047871 | A1* | 2/2009 | Muldowney | B24B 37/26 428/141 |
| 2015/0065014 | A1* | 3/2015 | Jensen | B24B 37/24 451/41 |
| 2015/0217424 | A1* | 8/2015 | Qian | B24B 37/245 451/539 |

FOREIGN PATENT DOCUMENTS

| | | | | | |
|---|---|---|---|---|---|
| CN | 112171513 | A | | 1/2021 | |
| EP | 0914904 | A2 | | 5/1999 | |
| EP | 1447841 | A1 | * | 8/2004 | H10P 52/00 |
| JP | 2001334455 | A | * | 12/2001 | B24D 3/32 |
| JP | 2003003156 | A | * | 1/2003 | |
| JP | 2004343090 | A | | 12/2004 | |
| JP | 2022038961 | A | | 3/2022 | |
| TW | 380082 | B | | 1/2000 | |
| TW | 201420706 | A | | 6/2014 | |
| WO | 2014047014 | A1 | | 3/2014 | |

OTHER PUBLICATIONS

JP 2001-334455 A, Ogawa Toshihiro et al, "Composition for polishing pad and polishing pad using it" English machine translation. Dec. 4, 2004 (Year: 2004).*

* cited by examiner

POLISH APPARATUS AND METHODS FOR USE

BACKGROUND

Generally, contacts down to a semiconductor substrate may be made by first forming a dielectric layer and then forming openings within the dielectric layer to expose the underlying substrate where contact is desired to be made. Once the openings have been formed, a barrier layer may be formed within the openings and conductive material may be used to fill the remainder of the openings using, e.g., a plating process. This plating process usually fills and overfills the openings, causing a layer of the conductive material to extend up beyond the dielectric layer.

A chemical mechanical polish (CMP) may be performed to remove the excess conductive material and the barrier layer from outside of the openings and to isolate the conductive material and the barrier layer within the openings. For example, the excess conductive material may be contacted to a polishing pad, and the two may be rotated in order to grind excess conductive material away. This grinding process may be assisted by the use of a CMP slurry, which may contain chemicals and abrasives that can assist in the grinding process and help remove the conductive material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
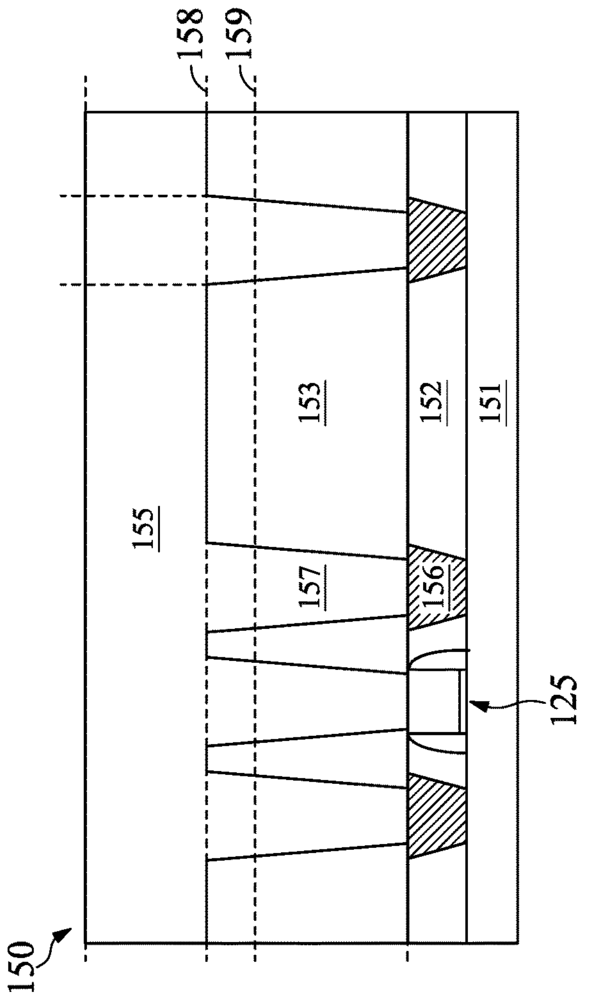
FIG. 1B illustrates an example of a workpiece that may be processed by the CMP system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below in a particular context, namely a chemical-mechanical polish (CMP) apparatus utilizing polishing pads with customizable polypeptides grafted to the surface of the polishing pads. Embodiments discussed herein relate to the use of the polypeptides to attract abrasives utilized in a CMP process. However, specific embodiments discussed herein are not intended to be limiting and all suitable CMP processes and structures are intended to be included within the scope of this application.

Figure 1A:
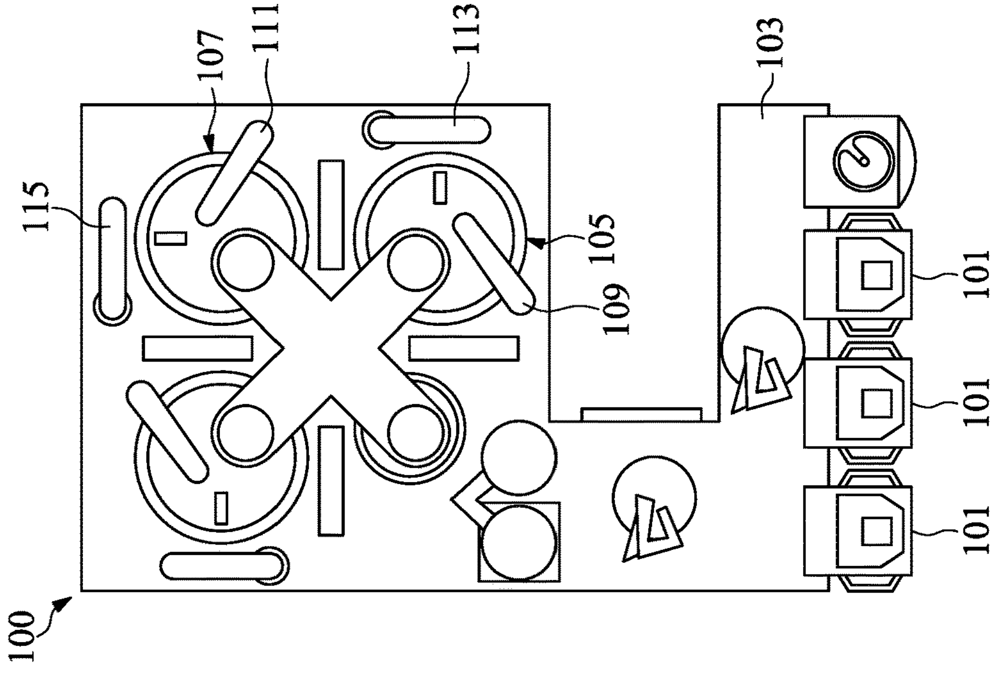
FIG. 1A illustrates a chemical mechanical polishing (CMP) system, in accordance with some embodiments.

FIG. 1A illustrates a chemical-mechanical polish (CMP) system 100 which may be used to remove excess material from a surface of a workpiece 150 (depicted in FIG. 1B) (e.g. excess conductive fill material, excess dielectric material, etc.). The CMP system 100 may include loadlocks 101, cleaning station 103, a high-rate platen 105, and a buffing platen 107. The loadlocks 101 may be used for loading the workpiece 150 into the CMP system 100, and then unloading the workpiece 150 once the CMP has been completed. The high-rate platen 105 and corresponding slurry dispensing system 109 may be used for polishing and removing an excess material (e.g. conductive materials) from the surface of the workpiece 150 with a relatively high polishing rate, such as a bulk polishing. The buffing platen 107 and corresponding buffing slurry dispenser system 111 may be used for polishing and removing the excess material (e.g. dielectric material) from the surface of the workpiece 150 and also to fix defects and scratches in the surface of the workpiece 150 that may occur during the bulk polishing of the excess material from the surface of the workpiece 150. In an embodiment, the CMP system 100 may additionally include a first enzyme spraying apparatus 113 associated with a surface renewal process 600 (see FIGS. 6A and 6B) used in conjunction with the high-rate platen 105. Further, in an embodiment, the CMP system 100 may additionally include a second enzyme spraying apparatus 115 associated with the surface renewal process 600 (see FIGS. 6A and 6B).

FIG. 1B illustrates a structure of the workpiece 150 to be processed in the CMP system 100. It should be noted that the illustrated workpiece 150 is merely one example of the structure of the workpiece 150 and is utilized for the convenience of the following discussion. However, any applicable structure for the workpiece 150 intended to be processed utilizing the CMP system 100 is fully intended to be covered by the following description.

In an embodiment, the workpiece 150 is illustrated as including a substrate 151, a first inter-layer dielectric (ILD) layer 152, source/drain plugs 156, active devices 125, a second ILD layer 153, contact plugs 157, a first conductive fill material 155, a first target level 158 of a bulk CMP material removal process, and a second target level 159 of a buffing CMP material removal process. However, any number of other suitable material layers may be included in the workpiece 150 and any desired number of target levels and any number of suitable CMP material removal processes may be applied.

In some embodiments, the substrate 151 may include active devices 125 formed within the substrate 151. As one of ordinary skill in the art will recognize, a wide variety of the active devices 125 and passive devices (not separately illustrated) such as transistors, capacitors, resistors, combinations of these, and the like may be used to generate the desired structural and functional requirements of the design for a semiconductor device and may be formed using any suitable methods.

The first ILD layer 152 may be formed over the substrate 151 in order to provide electrical isolation between the substrate 151 and overlying metallization layers (e.g., inter-metal dielectrics (IMD), redistribution layers, back end of the line (BEOL) metallization layers, or the like). The first ILD layer 152 may have a planarized surface and may be comprised of dielectric materials such as doped or undoped silicon oxide, silicon nitride, doped silicate glass, other high-k materials, combinations of these, or the like. In an embodiment the first ILD layer 152 may comprise a material such as boron phosphorous silicate glass (BPSG), although any suitable dielectrics may be used for either layer. After formation of the first ILD layer 152, the first ILD layer 152 may be planarized using, e.g., a CMP process.

The source/drain plugs 156 may be formed through the first ILD layer 152 to provide some of the electrical connections to the active devices 125. In an embodiment, contact plug openings (not separately illustrated) may be formed in the first ILD layer 152, and conductive fill material may be deposited in the contact plug openings formed through the first ILD layer 152 to fill and/or overfills the contact plug openings. In an embodiment the conductive fill material may be ruthenium, tungsten, tungsten nitride, aluminum, copper, silver, gold, rhodium, molybdenum, nickel, cobalt, cadmium, zinc, alloys of these, combinations thereof, and the like. The conductive fill material of the workpiece 150 may also be planarized using, e.g. a CMP process to planarize the conductive fill material with the first ILD layer 152.

The second ILD layer 153 may be formed over the planarized surface of the first ILD layer 152 covering the contact areas of the source/drain plugs 156. The contact plugs 157 may be formed in the second ILD layer 153 to electrically connect the source/drain plugs 156 of the active devices 125. According to some embodiments, the second ILD layer 153 and the contact plugs 157 formed within the second ILD layer 153 may be formed using the same materials and the same processes for forming the source/drain plugs 156 in the first ILD layer 152, as set forth above. In an embodiment, contact plug openings (not separately illustrated) may be formed in the second ILD layer 153, and the first conductive fill material 155 may be formed to fill the contact plug openings in the second ILD layer 153 to provide an electrical connection to the first ILD layer 152.

In some embodiments, the first conductive fill material 155 may be deposited in the contact plug openings formed through the second ILD layer 153 and the deposition of the first conductive fill material 155 may be continued until the first conductive fill material 155 fills the contact plug openings in the second ILD layer 153 and extends above the second ILD layer 153.

Figure 1C:
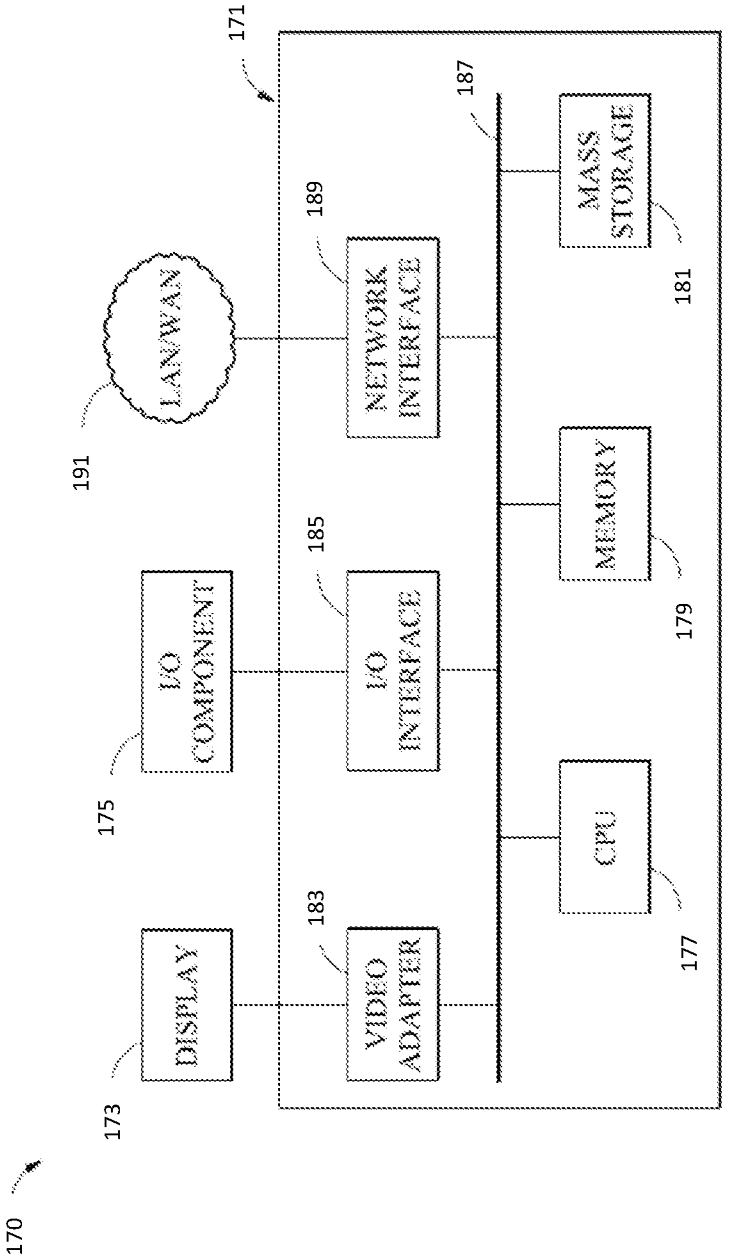
FIG. 1C illustrates an example of a control unit that may be utilized to control the CMP system, in accordance with some embodiments.

FIG. 1C illustrates an embodiment of a control unit 170 that may be utilized to control the CMP system 100 (as illustrated in FIG. 1A). The control unit 170 may be any form of computer processor that can be used in an industrial setting for controlling process machines. In an embodiment the control unit 170 may comprise a processing unit 171, such as a desktop computer, a workstation, a laptop computer, or a dedicated unit customized for a particular application. The control unit 170 may be equipped with a display 173 and one or more input/output components 175, such as instruction outputs, sensor inputs, a mouse, a keyboard, printer, combinations of these, or the like. The processing unit 171 may include a central processing unit (CPU) 177, memory 179, a mass storage device 181, a video adapter 183, and an I/O interface 185 connected to a bus 187.

The bus 187 may be one or more of any type of several bus architectures including a memory bus or memory controller, a peripheral bus, or video bus. The CPU 177 may comprise any type of electronic data processor, and the memory 179 may comprise any type of system memory, such as static random access memory (SRAM), dynamic random access memory (DRAM), or read-only memory (ROM). The mass storage device 181 may comprise any type of storage device configured to store data, programs, and other information and to make the data, programs, and other information accessible via the bus 187. The mass storage device 181 may comprise, for example, one or more of a hard disk drive, a magnetic disk drive, or an optical disk drive.

The video adapter 183 and the I/O interface 185 provide interfaces to couple external input and output devices to the processing unit 171. As illustrated in FIG. 1C, examples of input and output devices include the display 173 coupled to the video adapter 183 and the I/O component 175, such as a mouse, keyboard, printer, and the like, coupled to the I/O interface 185. Other devices may be coupled to the processing unit 171, and additional or fewer interface cards may be utilized. For example, a serial interface card (not shown) may be used to provide a serial interface for a printer. The processing unit 171 also may include a network interface 189 that may be a wired link to a local area network (LAN) or a wide area network (WAN) 191 and/or a wireless link.

It should be noted that the control unit 170 may include other components. For example, the control unit 170 may include power supplies, cables, a motherboard, removable storage media, cases, and the like. These other components, although not shown in FIG. 1C, are considered part of the control unit 170.

Figure 2B:
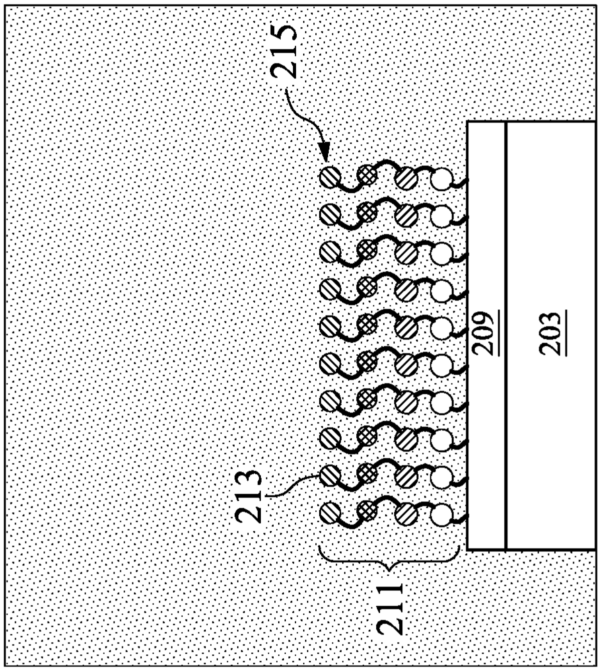
FIG. 2B illustrates the polishing pad of the CMP system coated in polypeptide chains with adjustable electrochemical properties, in accordance with some embodiments.
Figure 2A:
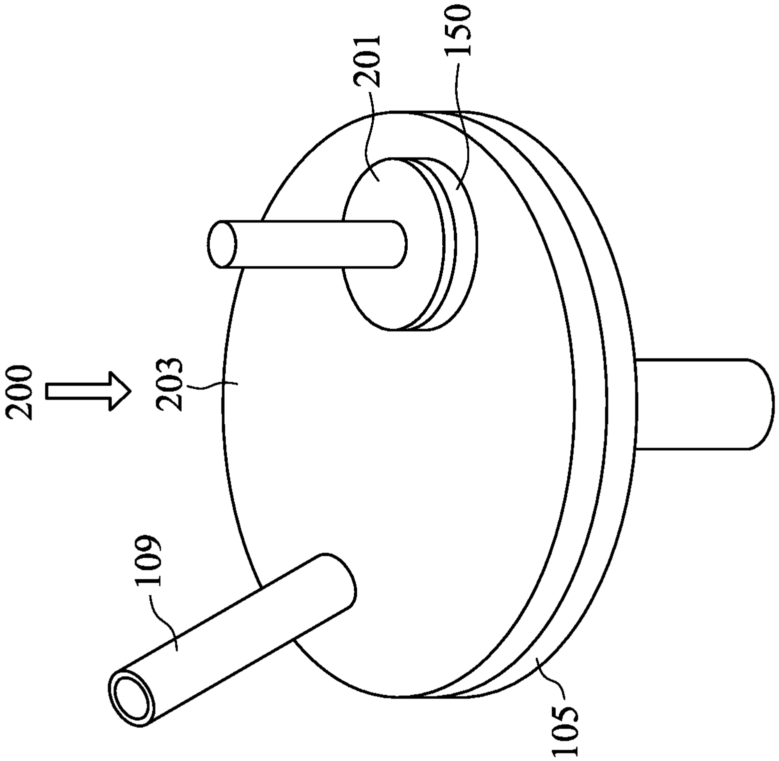
FIG. 2A illustrates a portion of the CMP system utilizing a polishing pad in conjunction with a CMP slurry, in accordance with some embodiments.

FIG. 2A illustrates a close up view of the CMP system 100 utilized in a CMP process 200. In an embodiment, the workpiece 150 may be loaded into the CMP system 100 through the loadlocks 101 and passed to the high-rate platen 105 for a bulk removal of the excess material (e.g. the first conductive fill material 155) from the surface of the workpiece 150 (see FIG. 1B). Once at the high-rate platen 105 (as illustrated in FIG. 2A), the workpiece 150 may be connected to a first carrier 201, which faces the surface of the workpiece 150 towards a first polishing pad 203 connected to the high-rate platen 105.

FIG. 2B illustrates a cross-sectional view of the first polishing pad 203. The first polishing pad 203 may be a hard polishing pad that may be utilized for a relatively quick removal of the excess material from the surface of the workpiece 150, (e.g. a bulk removal process). In an embodiment the first polishing pad 203 may be a single layer or composite layer of materials such as polyurethane or polyurethane mixed with fillers, and may have a hardness of no less than 50 on the Shore D Hardness scale. A surface of the first polishing pad 203 may be a roughened surface with micropores within it. However, any other suitable polishing pad may be used to remove a bulk of the excess material from the surface of the workpiece 150.

FIG. 2B further illustrates a grafting surface 209 on the first polishing pad 203 oriented to face the exposed surface of the workpiece 150 and a first polypeptide brush 211 comprising polypeptide chains 213 attached to the grafting surface 209. The polypeptide chains 213 are polymers comprising a plurality of amino acids bonded through peptide bonds to form an unbranching link of peptide residues 215. (e.g. a linear peptide chain). In an embodiment, the polypeptide chains 213 may be formed from various combinations of bonding various peptide residues 215. The various peptide residues 215 comprising of glycine, alanine, valine, leucine, isoleucine, phenylalanine, tryptophan, tyrosine, aspartic acid, histidine, asparagine, glutamic acid, lysine, glutamine, methionine, arginine, serine, threonine, cysteine, and proline residues, the like, or combinations thereof. However, any suitable peptide residues in any suitable combination may be utilized in forming the polypeptide chains 213 and are intended to be included within the scope of the embodiments discussed herein.

In an embodiment, the polypeptide chains 213 may have a residue length in a range from 5 to 200 peptide residues. If the polypeptide chains 213 are shorter than the residue length than the polypeptide chains 213 may not be able to adequately attract the first abrasives 311 (discussed in greater detail below with respect to FIGS. 3A and 3B) as well as have an inadequately short cycle lifespan (discussed in greater detail with respect to FIGS. 6A-6B). If the polypeptide chains 213 are longer than the residue length than the polypeptide chains 213 may significantly interfere with the functionality of the CMP process 200. In an embodiment where the polypeptide chains 213 have a peptide residue length longer than 50 peptide residues the polypeptide chain 213 is also a protein. Each of the various peptide residues 215 has an isoelectric point, where no net electric charge or difference in electrical potential exists occurring at a pH in a range from 2 pH to 12 pH.

In an embodiment, the polypeptide chains 213 may be selected to comprise the various peptide residues 215 such that an overall charge of the first polypeptide brush 211 is a zwitterionic polypeptide brush at the time of grafting the polypeptide chains 213 forming the first polypeptide brush 211, wherein the polypeptide chains 213 each individually have an overall net formal charge of zero, but the various peptide residues 215 may each individually have positive or negative charges within each of the polypeptide chains 213. The individual positive or negative charges of the various peptide residues 215, or a moiety charge value of the various peptide residues 215 are each associated with a specific pH value.

In an embodiment the polypeptide chains 213 are grafted to the grafting surface 209 forming the first polypeptide brush 211 by grafting-to (e.g., chemical modification) and grafting-from (e.g., polymerization) processes. In an embodiment, the first polypeptide brush 211 has a grafting density in a range of 0.05 polypeptide chains per $nm^2$ to 0.85 polypeptide chains per $nm^2$. If the grafting density is outside this range than the first polypeptide brush 211 may sufficiently impede the CMP process 200 or may not adequately attract first abrasives 311 (discussed in greater detail with respect to FIG. 3B).

Figure 3A:
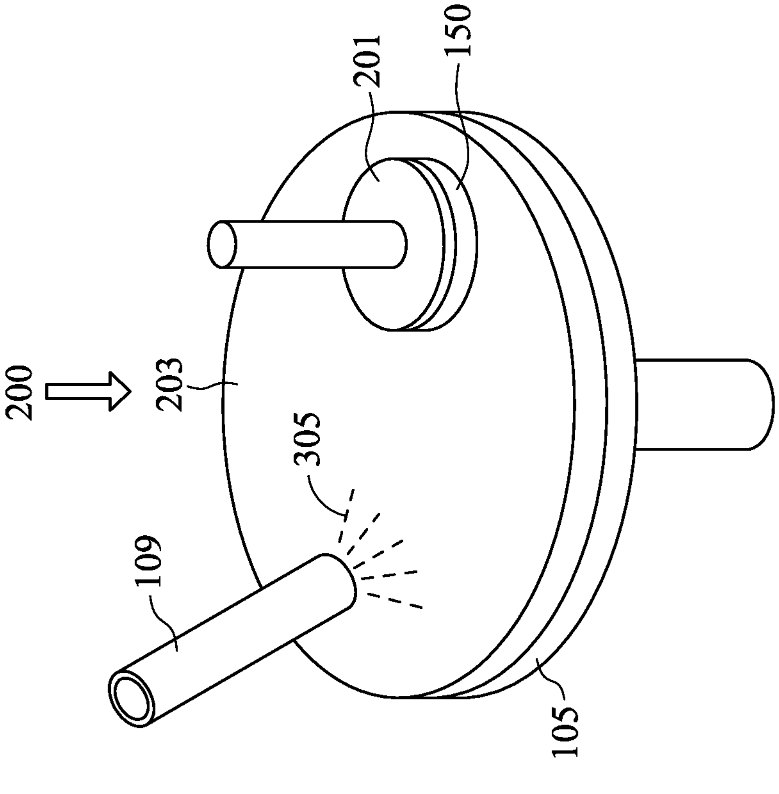
FIGS. 3A and 3B illustrate a bulk CMP process utilizing a polishing pad with a first set of polypeptide chains grafted to the surface of the polishing pad, in accordance with some embodiments.

FIG. 3A illustrates the slurry dispensing system 109 during the CMP process 200 utilized in the bulk removal process. In an embodiment, the CMP process 200 may be assisted through the use of a first bulk CMP slurry 305, which may be dispensed onto the first polishing pad 203 through the slurry dispensing system 109. In an embodiment the first bulk CMP slurry 305 may comprise a first reactant, first abrasives 311, a first surfactant, and a first solvent.

In an embodiment, the first reactant in the first bulk CMP slurry 305 may be a chemical, such as an oxidizer, that will chemically react with the excess material (e.g. the first conductive fill material 155) from the surface of the workpiece 150 in order to assist the first polishing pad 203 in grinding away the excess material. In an embodiment the first reactant may be an oxidizer, such as $K_3Fe(CN)_6$, $FeNO_3$, Br, or hydrogen peroxide ($H_2O_2$), or any other suitable reactant, such as guanidine, an amine, pyridine, combinations of these, and the like, that will aid in the removal of the excess material.

In an embodiment, the first abrasives 311 in the first bulk CMP slurry 305 may be any suitable particulate that, in conjunction with the first polishing pad 203, aids in the removal of the excess material from the surface of the workpiece 150. In an embodiment, the first abrasive 311 may comprise particulate such as titanium dioxide ($TiO_2$), silica (e.g., silicon dioxide ($SiO_2$)), aluminum oxide ($Al_2O_3$)), cerium oxide, polycrystalline diamond, polymer particles such as polymethacrylate or polymethacryclic, zirconia, germania, magnesia, the like, or a combination thereof. In some embodiments, the particulates may have a particle size of between about 300 nm and about 10 nm, such as 150 nm. It should be noted that any suitable abrasive particulates may be utilized for the first abrasive 311 and are fully intended to be included within the scope of the embodiments.

In an embodiment, the first surfactant may be utilized to help disperse the first reactant and the first abrasive 311 within the first bulk CMP slurry 305 and also prevent the first abrasive 311 from agglomerating during the CMP process 200. In an embodiment, the first surfactant may include sodium salts of polyacrylic acid, potassium oleate, sulfosuccinates, sulfosuccinate derivatives, sulfonated amines, sulfonated amides, sulfates of alcohols, alkylanyl sulfonates, carboxylated alcohols, alkylamino propionic acids, alkyliminodipropionic acids, combinations of these, or the like. However, these embodiments are not intended to be limited to these surfactants, as any suitable surfactant may be utilized as the first surfactant.

In an embodiment, the remainder of the first bulk CMP slurry 305 may be a first solvent that may be utilized to combine the first reactant, the first abrasive 311, and the first surfactant and allow the mixture to be moved and dispersed onto the first polishing pad 203. In an embodiment the first solvent of the first bulk CMP slurry 305 may be a solvent such as deionized water or an alcohol. However, any other suitable solvent may also be utilized as the first solvent. In an embodiment, a concentration of the first solvent in the first bulk CMP slurry 305 may be between about 99% by volume and about 70% by volume, such as about 95% by volume of the first bulk CMP slurry 305. The concentration of the first solvent in the first bulk CMP slurry 305 results in the first bulk slurry having a first pH value. In an embodiment, the first pH value may be in a pH range from 2 pH to 12 pH, such as 5 pH. The CMP slurry 305 having the first pH value results in an electrostatic attraction between the first abrasives 311 and a moiety charge on the polypeptide chain 213 associated with the first pH value.

In some embodiments, the first bulk CMP slurry 305 may comprise other additives. For example, the first bulk CMP slurry 305 may comprise a first additive that is a corrosion inhibitor. However, any other suitable additives may be utilized. Once mixed, the first bulk CMP slurry 305 may be dispensed onto the first polishing pad 203 by the slurry dispensing system 109.

Embodiments of the first bulk CMP slurry 305 disclosed herein refer to specific examples of reactants, abrasives, surfactants, solvents, and/or corrosion inhibitors. However, it is to be understood that any suitable reactant, abrasive, surfactant, solvent, and/or corrosion inhibitor may be utilized as the first reactant, the first abrasive 311, the first surfactant, the first solvent, and/or the other additives without departing from the spirit and scope of the embodiments described herein.

FIG. 3A further illustrates where the workpiece 150 attached to the first carrier 201 is mechanically ground against the first polishing pad 203 with the assistance of the first bulk slurry solution 305. In an embodiment, during the CMP process 200 the first carrier 201 may press the surface of the workpiece 150 against the first polishing pad 203. The workpiece 150 and the first polishing pad 203 are each rotated against each other, either in the same direction or else counter-rotated in opposite directions. By rotating the first polishing pad 203 and the workpiece 150 against each other, the first polishing pad 203 mechanically grinds away the excess material from the surface of the workpiece 150. Additionally, in some embodiments, the first carrier 201 may move the workpiece 150 back and forth along a radius of the first polishing pad 203.

In an embodiment, the first carrier 201 may push the workpiece 150 against the first polishing pad 203 on the high-rate platen 105 with a force of between about 600 hpa to about 30 hpa, such as about 250 hpa. In some embodiments, as the high-rate platen 105 rotates the first polishing pad 203 underneath the workpiece 150, the first bulk CMP slurry 305 is applied to the exposed surface of the workpiece 150 in order to assist in the removal of the excess material on the exposed surface of the workpiece 150. In an embodiment, during the CMP process 200, the high-rate platen 105 rotates at a speed of between about 20 rpm to about 400 rpm and the first carrier 201 rotates the workpiece 150 at a speed of about 20 rpm to about 400 rpm. Utilizing the specified force at the specified rotation speeds provides for adequate bulk removal of the excess material from the workpiece 150.

By rotating the first polishing pad 203 and the workpiece 150 against each other using the first bulk CMP slurry 305, the first polishing pad 203 along with the assistance of the first abrasive 311 in the first bulk CMP slurry 305 mechanically grinds away the excess material from the surface of the workpiece 150 at a first rate of removal.

Additionally, beyond just physically removing a portion of the excess material from the exposed surface of the workpiece 150, the CMP process 200 with the first reactant and the first abrasive 311 may react with a portion of the excess material of the workpiece 150 to form a sacrificial layer (not shown) along the exposed surface of the workpiece 150. The sacrificial layer may then be removed by the grinding effect of the first polishing pad 203 along with the assistance of the first abrasive 311 within the first bulk CMP slurry 305. In particular, the first reactant and the first abrasive 311 may react with portions of the excess material on the exposed surface of the workpiece 150 to effectively boost the rate of removal of the excess material.

Figure 3B:
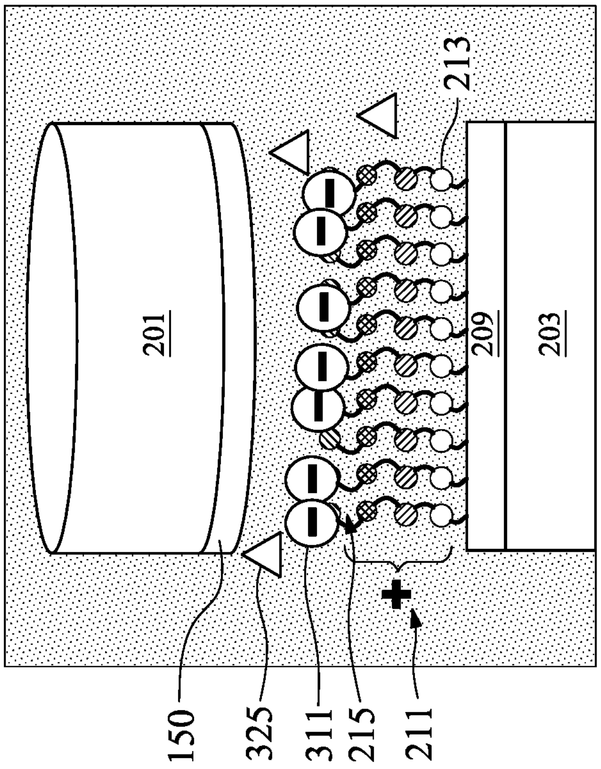

FIG. 3B illustrates a cross-sectional view of the first polishing pad 203 where the first abrasives 311 are held by the polypeptide chains 213 of the polypeptide brush by the electrostatic attraction caused by the moiety charges occurring on the polypeptide chains 213 at the first pH value during the bulk removal process. In an embodiment, the first pH value is associated with shifting a one or more of the various peptide residues 215 from its isoelectric point to the one or more of the various peptide residues 215 having a net charge, e.g. a controlled moiety charge within the polypeptide chains 213. In an embodiment, the first pH value is established by controlling the concentration of the first solvent in the first bulk CMP slurry 305 such that the resulting controlled moiety charge of the various peptide residues 215 occurring at the first pH value is electrostatically attracted to the first abrasive 311 in the first bulk CMP slurry 305. In an embodiment, the first pH value can be adjusted to target the various peptide residues 215 to establish electrostatic attraction between the various peptide residues 215 and specific abrasives that may be utilized in the first abrasive 311 in the first bulk CMP slurry 305. In this embodiment the different abrasives that may be used in the first abrasive 311 may have different electrostatic potentials which may require a different moiety charge occurring on the polypeptide chains 213 to establish the electrostatic attraction between the first abrasive 311 and the polypeptide chains 213.

It should be noted that while the first abrasive 311 is illustrated as having an associated negative charge and the first polypeptide brush 211 is illustrated has having an associated positive charge, this is merely for illustrative purposes. The associated charges resulting in the electrostatic attraction between the first abrasive 311 and the first polypeptide brush 211 may both be derived from associated positive and negative charges on either the first abrasive 311 and the first polypeptide brush 211.

FIG. 3B additionally illustrates the presence of first residual particles 325 above the surface of the first polishing pad 203 that may be formed or accumulated during the CMP process 200. In an embodiment, the first residual particles 325 may be organic material that may originate, e.g., as debris from the first polishing pad 203, debris associated with the first surfactant within the first bulk CMP slurry 305, byproducts produced from the first reactant, pipeline debris, or other debris from the CMP process 200.

Figure 4A:
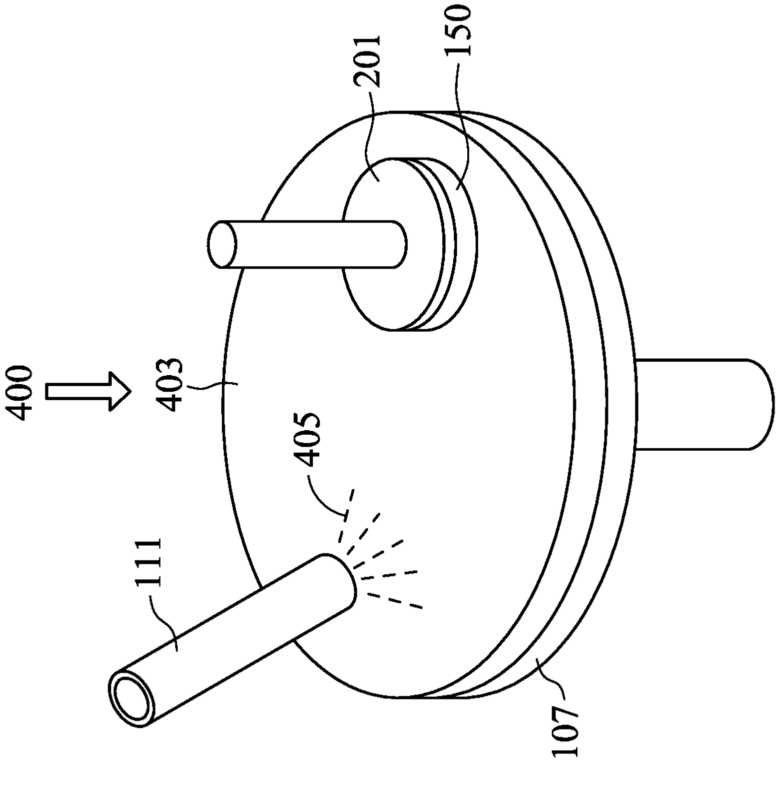
FIGS. 4A and 4B illustrate a buffing CMP process utilizing a polishing pad with a second set of polypeptide chains grafted to the surface of the polishing pad, in accordance with some embodiments.

FIG. 4A illustrates an embodiment in which the CMP process 200 further includes a buffing CMP process 400 performed on the workpiece 150 following the bulk removal of the excess material from the workpiece 150. In an embodiment, the workpiece 150 may be removed from the high-rate platen 105 and may be transferred to the buffing platen 107, where the outer surface of the workpiece 150 faces towards a second polishing pad 403 on the buffing platen 107. The second polishing pad 403 may perform a similar CMP process as the high-rate platen 105, with the second polishing pad 403 grinding away the excess material from the outer surface of the workpiece 150 to the second target level 159 (see FIG. 1B). In addition, the buffing CMP process 400 may include a buffing CMP slurry 405 being dispersed by the buffing slurry dispenser 111 to aid in the grinding process. In an embodiment the buffing CMP slurry 405 may comprise a second reactant, a second abrasive 411, a second surfactant, and a second solvent. In some embodiments, the second reactant, the second abrasive 411, the second surfactant, and the second solvent of the buffing CMP slurry 405 may be similar to the first reactant, the first abrasive 311, the first surfactant, and the first solvent that is used in the first bulk CMP slurry 305. However, any suitable reactant, abrasive, surfactant, solvent, and/or corrosion inhibitor may be utilized as the second reactant, the second abrasive 411, the second surfactant, the second solvent, and/or the corrosion inhibitor without departing from the spirit and scope of the embodiments described herein.

Once mixed, the buffing CMP slurry 405 may be dispensed onto the second polishing pad 403 by the buffing slurry dispenser 111. In an embodiment, the buffing CMP slurry 405 may be dispensed onto the second polishing pad 403 at a rate of between about 2000 sccm and about 100 sccm. In addition, the workpiece 150 may be forced into contact with the second polishing pad 403 by the first carrier 201 pressing the surface of the workpiece 150 against the second polishing pad 403. In an embodiment of the buffing CMP process 400, the first carrier 201 may push the workpiece 150 onto the buffing platen 107 with a force of between about 500 hpa to about 50 hpa, such as about 200 hpa. As the buffing platen 107 rotates the second polishing pad 403 underneath the workpiece 150, the buffing CMP slurry 405 is applied to the exposed surface of the workpiece 150 in order to assist in the removal of the excess material from the exposed surface of the workpiece 150. In an embodiment, during the buffing CMP process 400, the buffing platen 107 rotates at a speed of between about 30 rpm to about 300 rpm while the first carrier 201 rotates the workpiece 150 at a speed of about 30 rpm to about 300 rpm. Utilizing the specified force at the specified rotation speeds provides for adequate buffering of the excess material from the workpiece 150.

By rotating the second polishing pad 403 and the workpiece 150 against each other using the buffing CMP slurry 405, the second polishing pad 403 along with the assistance of the second abrasive 411 in the buffing CMP slurry 405 mechanically grinds away the excess material from the exposed surface of the workpiece 150 at a second rate of removal. In some embodiments, the first rate of removal may be greater than the second rate of removal.

In an embodiment the second polishing pad 403 may be a soft buffing pad which may remove the excess material from the exposed surface of the workpiece 150 at a slower and more controlled rate than the first polishing pad 203. In addition, different particulates may be utilized for the second abrasive 411 during the buffing CMP process 400 than for the first abrasive 311 utilized during the bulk CMP process.

Figure 4B:
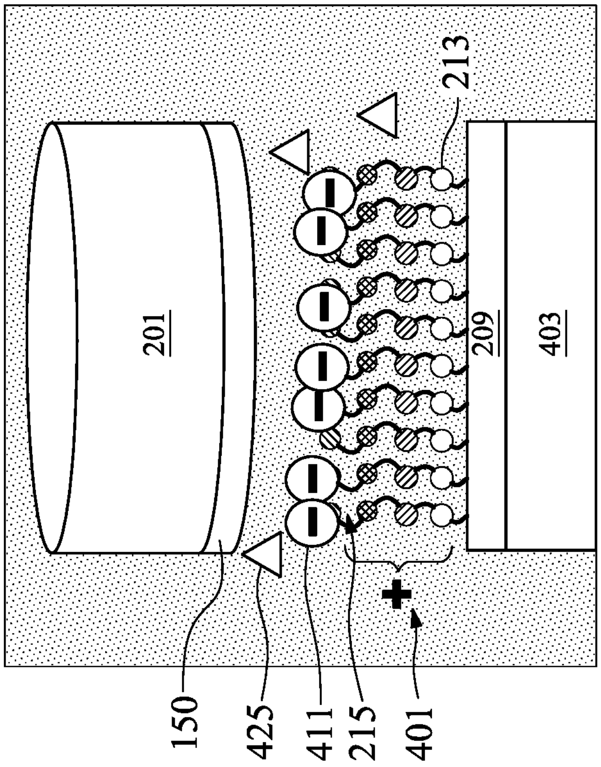

FIG. 4B illustrates a cross-sectional view of the second polishing pad 403 where the second abrasives 411 may be held in the polypeptide chains 213 of a second polypeptide brush 401 by the electrostatic attraction caused by the moiety charges occurring on the polypeptide chains 213 and electrostatic charges on the second abrasives 411. In an embodiment, the buffing CMP process 400 may utilize different abrasives for the second abrasives 411 than the first abrasives 311 utilized during the bulk removal process. In this embodiment, the polypeptide chains 213 may be selectively formed from the various peptide residues 215 so that the electrostatic attraction may occur between the moiety charges occurring on the polypeptide chains 213 and the second abrasives 411 at a second pH value. In this embodiment the second pH value may be controlled in a similar manner as how the first pH value is controlled during the bulk removal process, such as controlling the second pH value by adjusting a concentration of the second solvent in the buffing CMP slurry 405.

It should be noted that while the second abrasive 411 is illustrated as having an associated negative charge and the second polypeptide brush 401 is illustrated has having an associated positive charge, this is merely for illustrative purposes. The associated charges resulting in the electrostatic attraction between the second abrasive 411 and the second polypeptide brush 401 may both be derived from associated positive and negative charges on either the second abrasive 411 and the second polypeptide brush 401.

FIG. 4B additionally illustrates the presence of second residual particles 425 above the surface of the second polishing pad 403 that may be formed or accumulated during the buffering CMP process 400. In an embodiment, the second residual particles 425 may be organic material that may originate, e.g., as debris from the second polishing pad 403, debris associated with the second surfactant within the buffering CMP slurry 405, byproducts produced from the second reactant, pipeline debris, or other debris from the buffering CMP process 400.

However, as one of ordinary skill in the art will recognize, the above description of removing the excess material from the exposed surface of the workpiece 150 in a single processing step is merely an illustrative example and is not intended to be limiting upon the embodiments. Any number of cycles of the CMP process 200 and any number of platens may be utilized to remove the excess material from the workpiece 150, and all such combinations are fully intended to be included within the scope of the embodiments. Further, while the discussion of the CMP process 200 with respect to the workpiece 150 illustrated in FIG. 1B is described with respect to planarizing to two target levels (e.g. the first target level 158 and the second target level 159), any desired number of target levels and any number of suitable cycles of the CMP process 200 may be applied to the workpiece 150. Additionally, in some embodiments, the CMP process 200 may be utilized for the planarization of other structures discussed with respect to the workpiece 150, such as, the first ILD layer 152, the conductive fill material for the source/drain plugs 156, etc. As illustrated above, a basic structure such as the workpiece 150 described above may utilize the processes discussed with respect to the CMP process 200 for a multitude of both conductive materials and dielectric materials in both bulk removal and in polishing at multiple levels across multiple structures of the workpiece 150. Additionally, embodiments discussed herein with respect to the CMP process 200 may be applied with other varying process parameters for use in other planarization processes but are fully intended to be included within the scope of the present application.

Figure 5A:
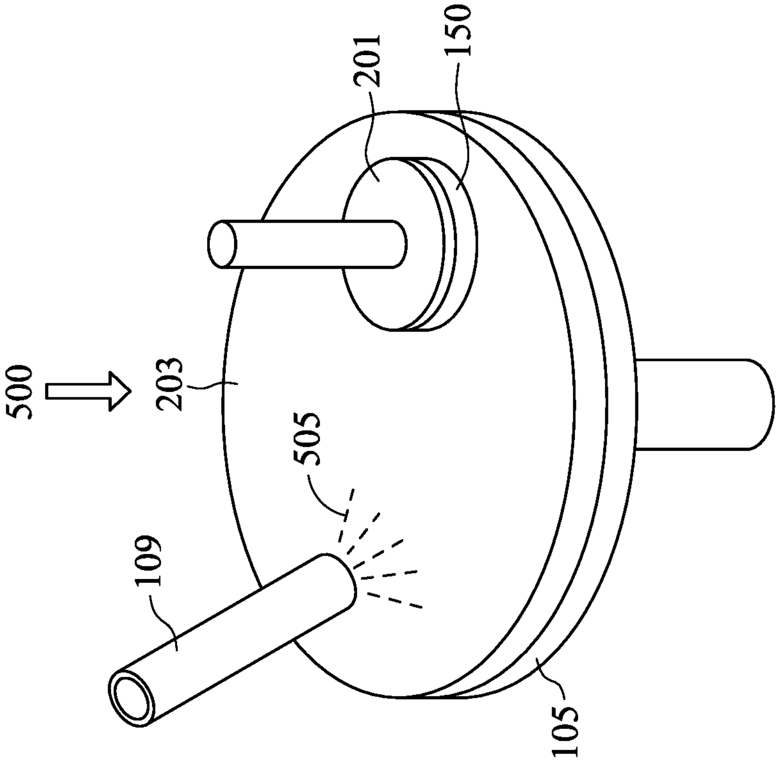
FIGS. 5A and 5B illustrate a CMP cleaning process utilizing a cleaning solution to adjust the pH value of the polypeptide chains to repel abrasives, in accordance with some embodiments.

FIG. 5A illustrates a cleaning CMP process 500 utilized for cleaning the first polypeptide brush 211 to remove the first abrasive 311 from the first polypeptide brush 211 after running the CMP process 200 from the first polishing pad 203. In an embodiment, the first abrasive 311 in the first polypeptide brush 211 occurs due to the electrostatic attraction between the first polypeptide brush 211 and the first abrasive 311 formed during the bulk removal process. In an embodiment, the cleaning CMP process 500 for cleaning the first polypeptide brush 211 disposed over the first polishing pad 203 may be performed utilizing the high-rate platen 105 and changing the bulk slurry dispensing system 109 from dispensing the bulk CMP slurry 305 to dispensing a cleaning solution 505.

According to some embodiments, the cleaning solution 505 may comprise a cleaning reactant, an optional cleaning surfactant, and a third solvent without the use of abrasives. In an embodiment the cleaning reactant may be a chemical which can help to remove the first residual particles 325. In an embodiment applying the cleaning solution 505 to the first polypeptide brush 211 results in the first polypeptide brush 211 being at a third pH value. In an embodiment the third pH value may change either the moiety charge on the various peptide residues 215 or the electrostatic charge associated with the first abrasive 311 resulting in an electrostatic repulsion between the associated moiety charge on the polypeptide chains 213 of the first polypeptide brush 211 and the resulting like electrostatic charge associated with the first abrasive 311. In an embodiment, the third pH value may be controlled by adjusting a concentration of the third solvent in a similar manner as to how the first pH value may be controlled in the first bulk CMP slurry 305, to establish the electrostatic repulsion between the first abrasive 311 and the polypeptide chains 213.

Figure 5B:
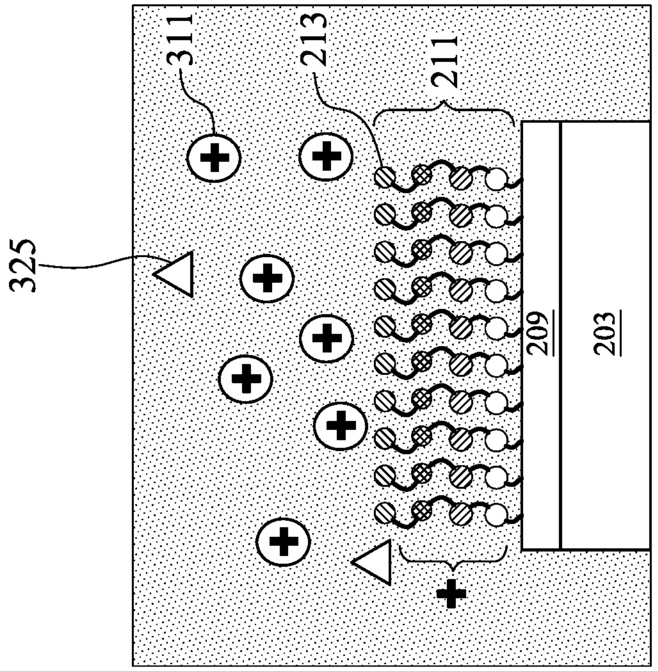

FIG. 5B illustrates a cross-sectional view of the electrostatic repulsion between the first abrasive 311 and the moiety charges occurring on the polypeptide chains 213 at the third pH value. In an embodiment, the third pH value is associated with shifting the various peptide residues 215 from a first moiety charge to a second moiety charge that results in the electrostatic repulsion between the charge on the various peptide residues 215 within the polypeptide chains 213 and the charge of the first abrasive 311 at the third pH value. In an embodiment, the electrostatic repulsion between the first abrasive 311 and the moiety charge occurring on the polypeptide chains 213 at the third pH value detaches the first abrasive 311 from the polypeptide chains 213 and drives the first abrasive 311 out of the first polypeptide brush 211. Following the cleaning CMP process 500, the polypeptide brushes 211 may be substantially cleaned of the first abrasive 311 and the polypeptide brushes 211 may be utilized in the CMP process 200 again.

It should be noted that while the first abrasive 311 is illustrated as having an associated positive charge and the first polypeptide brush 211 is illustrated has having an associated positive charge, this is merely for illustrative purposes. The associated charges resulting in the electrostatic repulsion between the first abrasive 311 and the first polypeptide brush 211 may both be derived from associated positive and negative charges on either the first abrasive 311 and the first polypeptide brush 211.

In another embodiment, the cleaning CMP process 500 may be applied in a similar manner, as discussed above with respect for cleaning the first polypeptide brush 211 over the first polishing pad 203, as for cleaning the second polypeptide brush 401 over the second polishing pad 403. In this embodiment the cleaning solution 505 may be dispensed from the buffing slurry dispenser system 111 to remove the second abrasive 411 from the second polypeptide brush 401 after running the buffing CMP process 400 from the second polishing pad 403 (not separately illustrated) by changing the pH value resulting in the electrostatic repulsion between the second abrasive 411 and the polypeptide chains 213 over the second polishing pad 403, the electrostatic repulsion driving the second abrasive 411 from the second polypeptide brush 401. Further, in an embodiment the cleaning reactant may be a chemical which can help to remove the second residual particles 425 (not separately illustrated).

By utilizing the first polypeptide brush 211 over the first polishing pad 203 utilized in a bulk removal CMP process and utilizing the second polypeptide brush 401 over the second polishing pad 403 utilized in a buffing CMP process 400 allows for capture and removal of the first abrasive 311 and the second abrasive 411 without the use of pad conditioning requiring mechanical force. By embedding polypeptide chains 213 into surfaces of polishing pads in order to utilize the electrostatic potentials of the peptide residues 215 within the polypeptide chains 213 to both attract and repel the first abrasive 311 and the second abrasive 411 by adjusting pH values to modify the moiety charges on the polypeptide chains 213 defects caused by disk dressing alternatively used to remove the first abrasive 311 and the second abrasive 411 may be avoided. Additionally, pad debris caused from pad conditioning using mechanical force can be avoided, further reducing the potential for defects caused by this pad debris. Additionally, by avoiding pad conditioning using mechanical force the lifespan of polishing pads utilizing the polypeptide brush may be improved along with improved throughput.

Figure 6B:
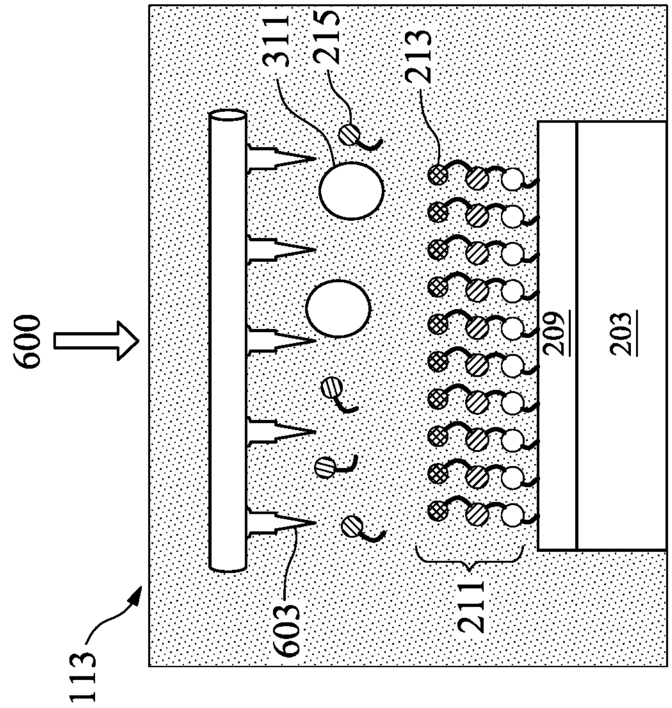
FIGS. 6A and 6B illustrate an enzyme based peptide residue cleaving system to cleave peptide residues from the polypeptide chains, in accordance with some embodiments.
Figure 6A:
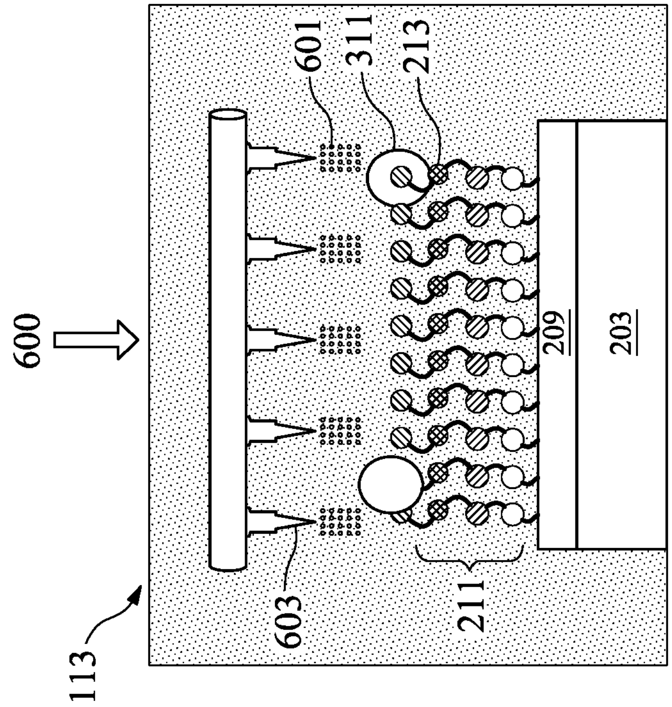

FIGS. 6A and 6B illustrate a surface renewal process 600 performed on the first polypeptide brush 211 after the first polypeptide brush 211 has been run through one or more cycles of the CMP process 200. In FIGS. 6A and 6B the first enzyme spraying apparatus 113 (see FIG. 1A) is positioned above the first polypeptide brush 211 over the first polishing pad 203 on the high-rate platen 105 (see FIG. 1A). In an embodiment the first enzyme spraying apparatus 113 is configured to dispense an enzymatic solution 601 onto the polypeptide chains 213 of the first polypeptide brush 211 through the use of enzyme spraying nozzles 603. In an embodiment, the surface renewal process 600 may be performed on the first polypeptide brush 211 after the first polypeptide brush 211 has undergone a predetermined number of cycles of the CMP process 200. In an embodiment the predetermined number of cycles is in a range of 100 cycles to 1000 cycles, such as 500 cycles. The predetermined number of cycles the CMP process 200 that the first polypeptide brush 211 may undergo may be selected as to preserve the integrity and functionality of the first polypeptide brush 211, wherein after the predetermined number of cycles of the CMP process 200 the first polypeptide brush 211 may begin to degrade.

FIG. 6A illustrates the first enzyme spraying apparatus 113 dispensing the enzymatic solution 601 through the enzyme spraying nozzles 603 onto the first polypeptide brush 211 over the first polishing pad 203, wherein some of the first abrasives 311 remain in between the polypeptide chains 213 of the first polypeptide brush 211 even after the cleaning CMP process 500. In an embodiment, the enzymatic solution 601 comprises a group set of aminopeptidases, carboxypeptidases, exopeptidases, the like, or a combination thereof. In an embodiment, the enzymatic solution 601 comprises first enzymes with a molecular mass in a range between 20 kDa and 150 kDa, such as 80 kDa. If the first enzymes do not have a molecular mass in this range then the enzymatic solution 601 may not be able to adequately perform catalytic activity which hindered by their conformation structure.

In an embodiment, the first enzyme spraying apparatus 113 dispenses the enzymatic solution 601 at a volumetric flow rate in a range of 20 μL per min to 150,000 μL per min, such as 1000 μL per min. If the volumetric flow rate is not within this range then the enzymatic solution 601 may not be able to adequately cleave the specific terminals. Additionally, the first enzyme spraying apparatus 113 may be configured with a temperature regulator (not separately illustrated). The temperature regulator is configured to maintain a temperature of the enzymatic solution 601 in a range of 25°

C. to 80° C. while the enzymatic solution 601 is both kept in an enzyme solution tank (not separately illustrated) connected to the first enzyme spraying apparatus 113 and while dispensing the enzyme solution 601 to the polypeptide chains 213. If the temperature of the enzymatic solution 601 is not maintained at this temperature range than the enzymatic solution 601 may not be able to keep its enzymatic activity and exposed to risks of denaturation. In an embodiment, the first enzyme spraying apparatus 113 comprises a multitude of the enzyme spraying nozzles 603, the number of enzyme spraying nozzles 603 is proportional to the size of the first polypeptide brush 211 so that the enzymatic solution 601 is evenly distributed across the polypeptide chains 213.

FIG. 6B illustrates the results of the first enzyme from the enzymatic solution 601 reacting with the polypeptide chains 213 resulting in a cleaving of one of the various peptide residues 215. In an embodiment, an enzymatic cleaving of the various peptide residues 215 releases the first abrasive 311 that may have become entangled after several cycles of the CMP process 200 in which the cleaning CMP process 500 may be unable to remove these entangled first abrasive 311 within the first polypeptide brush 211. In an embodiment, following the enzymatic cleaving the cleaved peptide residue 215 and the released first abrasive 311 may be removed from the first polypeptide brush 211 utilizing a rinsing solution, such as a water rinse.

In an embodiment, an initial length of the polypeptide chain 213 is proportional to a number of times that the first polypeptide brush 211 may undergo the surface renewal process 600, for example, if the residue length of the polypeptide chain 213 is 200 peptide residues 215 long the first polypeptide brush 211 may undergo the surface renewal process 600 by a maximum of 195 times, where likewise, if the residue length of the polypeptide chain 213 is 6 peptide residues long, the first polypeptide brush 211 may only undergo the surface renewal process 600 a singular time as to not over cleave the polypeptide chains 213 and thereby impacting their ability to attract the first abrasive 311.

Further, in an embodiment, utilizing the surface renewal process 600 to cleave the various peptide residues 215 the composition of the polypeptide chains 213 may be selectively adjusted to alter the electrostatic potential properties of the polypeptide chains 213 and the resulting moiety charge values. In this embodiment the selective cleaving of the various peptide residues 215 can be utilized to target specific abrasives desired to be utilized in the CMP process 200 based on the altered electrostatic potential properties of the resulting polypeptide chain 213.

In an embodiment, the surface renewal process 600 may be applied utilizing a second enzyme spraying apparatus 115 (see FIG. 1A, not separately illustrated in FIGS. 6A and 6B) to dispense the enzymatic solution 601 through the enzyme spraying nozzles 603 onto the second polypeptide brush 401 over the second polishing pad 403 (not separately illustrated), wherein some of the second abrasive 411 remains in between the polypeptide chains 213 of the second polypeptide brush 401 even after the cleaning CMP process 500. The surface renewal process 600 as applied utilizing the second enzyme spraying apparatus 115 may utilize similar materials under similar parameters as discussed above with respect the surface renewal process 600 applied by the first enzyme spraying apparatus 113.

By utilizing the enzymatic solution 601 to enzymatically cleave the various peptide residues 215 the lifespan of the resulting polypeptide brush [213] may be improved. Additionally, removal of the first abrasive 311 and the second abrasive 411 that may have become entangled in the first polypeptide brush 211 after multiple runs of the CMP process 200 allows for maintaining the high fidelity and reduced defect risk associated with the use of the first polypeptide brush 211 on the surface of the polishing pads. Also the customization of the polypeptide chains 213 to form the polypeptide brushes 211 with varying polypeptide chain 213 grafting density and targeted moiety charge values associated with specific abrasives, the selective cleaving of the various peptide residues 215 by the surface renewal process 600 to alter the electrostatic potential properties of the polypeptide chains 213 to target other specific abrasives allows for even greater customization and flexibility of abrasives utilized in the CMP process 200.

By utilizing the first polypeptide brush 211 the use of mechanical force dependent pad conditioning can be avoided. The benefit of not having to rely on mechanical force dependent pad conditioning is the flexibility in abrasives that can be utilized with the CMP process 200 as compared to traditional pads were residual abrasives may react poorly, both mechanically and chemically, with certain materials of the workpiece 150 to be planarized by the CMP process 200. The improved removal of the abrasives also improves the fidelity of the resulting product produced through the CMP process 200. Further, by avoiding grinding down polishing pads to remove abrasives during mechanical force dependent pad conditioning the lifespan and integrity of the polishing pad may be improved. Further, by introducing the surface renewal process 600 to selectively cleave the various peptide residues 215 the lifespan and fidelity of the polishing pads may further be improved. The selective cleaving of the various peptide residues also provide additional flexibility in the selectivity of the abrasives that may be utilized during the CMP process 200.

In accordance with some embodiments of the present disclosure, a polishing apparatus including: a platen; a polishing pad coated with polypeptides over the platen; and an enzyme spraying device positioned adjacent to the polishing pad. In an embodiment, the polypeptides have a grafting density on the polishing pad in a range of 0.05 polypeptide chains per $nm^2$ to 0.85 polypeptide chains per $nm^2$. In an embodiment, each polypeptide of the polypeptides comprises 5 peptide residues to 200 peptide residues. In an embodiment, the polypeptides include at least one of a glycine residue, an alanine residue, or a valine residue. In an embodiment, the polypeptides include at least one of a leucine residue, an isoleucine residue, or a phenylalanine residue. In an embodiment, the enzyme spraying device is connected to a container storing an enzymatic solution comprising one or more of aminopeptidases, carboxypeptidases, or exopeptidases. In an embodiment, the polypeptides are zwitterionic polypeptides.

In accordance with some embodiments of the present disclosure, a method of polishing including: introducing a slurry including of particulates to a polishing pad layered with polypeptide chains, wherein the introducing the slurry electrostatically adheres at least some of the particulates to the polypeptide chains; and introducing a cleaning solution to the polishing pad, wherein the introducing the cleaning solution changes an electrostatic charge of either the polypeptide chains or the particulates to detach the particulates from the polypeptide chains. In an embodiment, prior to introducing the slurry, the polypeptide chains are isoelectric and after introducing the slurry the polypeptide chains have a net charge. In an embodiment, the slurry has a first pH value that induces a first electrostatic charge on the polypeptide chains. In an embodiment, the cleaning solution has a second pH value that induces a second electrostatic charge on the polypeptide chains, wherein the second electrostatic charge forms an electrostatic repulsion between the particulates and the polypeptide chains. In an embodiment, applying an enzyme spray to the polishing pad, wherein the enzyme spray cleaves off a top peptide residue of the polypeptide chains. In an embodiment, the enzyme spray is applied to the polishing pad at a temperature in a range of 25° C. to 80° C. In an embodiment, applying the enzyme spray includes one or more of aminopeptidases, carboxypeptidases, or exopeptidases. In an embodiment, the polypeptide chains have a grafting density in a range of 0.05 polypeptide chains per $nm^2$ to 0.85 polypeptide chains per $nm^2$.

In accordance with some embodiments of the present disclosure, a method of polishing including: dispensing a slurry solution at a first pH value onto a first surface of a polishing pad, the first surface of the polishing pad including a plurality of polypeptide chains, wherein the slurry solution includes abrasives that adhere to the plurality of polypeptide chains when in an environment at the first pH value; and after dispensing the slurry solution, water polishing the polishing pad, wherein the water polishing adjusts the slurry solution with the first pH to a second pH, wherein the abrasives detach from the plurality of polypeptide chains when the environment is at the second pH. In an embodiment, the plurality of polypeptide chains comprise 5 to 200 peptide blocks. In an embodiment, applying an enzyme solution to the polishing pad, wherein the enzyme solution cleaves a top most peptide from the plurality of polypeptide chains. In an embodiment, the enzyme solution includes enzymes with a molecular mass in a range between 20 kDa and 150 kDa. In an embodiment, a temperature of the enzyme solution is controlled to be in a range of 25° C. to 80° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed:

1. A method of polishing comprising:

introducing a slurry comprising of particulates to a polishing pad layered with polypeptide chains, wherein introducing the slurry electrostatically adheres at least some of the particulates to the polypeptide chains; and introducing a cleaning solution to the polishing pad, wherein introducing the cleaning solution changes an electrostatic charge of either the polypeptide chains or the particulates to detach the particulates from the polypeptide chains.

2. The method of claim 1, wherein prior to introducing the slurry, the polypeptide chains are isoelectric and after introducing the slurry the polypeptide chains have a net charge.

3. The method of claim 1, wherein the slurry has a first pH value that induces a first electrostatic charge on the polypeptide chains.

4. The method of claim 3, wherein the cleaning solution has a second pH value that induces a second electrostatic charge on the polypeptide chains, wherein the second electrostatic charge forms an electrostatic repulsion between the particulates and the polypeptide chains.

5. The method of claim 1, further comprising applying an enzyme spray to the polishing pad, wherein the enzyme spray cleaves off a top peptide residue of the polypeptide chains.

6. The method of claim 5, wherein the enzyme spray is applied to the polishing pad at a temperature in a range of 25° C. to 80° C.

7. The method of claim 5, wherein applying the enzyme spray comprises one or more of aminopeptidases, carboxypeptidases, or exopeptidases.

8. The method of claim 1, wherein the polypeptide chains have a grafting density in a range of 0.05 polypeptide chains per $nm^2$ to 0.85 polypeptide chains per $nm^2$.

9. A method of polishing comprising:

dispensing a slurry solution at a first pH value onto a first surface of a polishing pad, the first surface of the polishing pad comprising a plurality of polypeptide chains, wherein the slurry solution comprises abrasives that adhere to the plurality of polypeptide chains when in an environment at the first pH value; and after dispensing the slurry solution, water polishing the polishing pad, wherein the water polishing adjusts the slurry solution with the first pH to a second pH, wherein the abrasives detach from the plurality of polypeptide chains when the environment is at the second pH.

10. The method of claim 9, wherein the plurality of polypeptide chains comprise 5 to 200 peptide blocks.

11. The method of claim 9, further comprising applying an enzyme solution to the polishing pad, wherein the enzyme solution cleaves a top most peptide from the plurality of polypeptide chains.

12. The method of claim 11, wherein the enzyme solution comprises enzymes with a molecular mass in a range between 20 kDa and 150 kDa.

13. The method of claim 11, wherein a temperature of the enzyme solution is controlled to be in a range of 25° C. to 80° C.

14. A method of polishing comprising:

dispensing a bulk slurry at a first pH value onto a first polishing pad coated with first polypeptide chains, wherein the first pH value causes a moiety charge on peptide residues within the first polypeptide chains that electrostatically adheres first abrasives in the bulk slurry to the first polypeptide chains;

removing excess material from a workpiece using the first polishing pad;

dispensing a buffing slurry at a second pH value onto a second polishing pad coated with second polypeptide chains, wherein the second pH value causes a moiety charge on peptide residues within the second polypeptide chains that electrostatically adheres second abrasives in the buffing slurry to the second polypeptide chains; and buffing the workpiece using the second polishing pad.

15. The method of claim 14, wherein the first pH value is in a range from 2 pH to 12 pH.

16. The method of claim 14, wherein the first pH value is controlled by adjusting a concentration of a solvent in the slurry solution.

17. The method of claim 14, wherein the polypeptide chains are zwitterionic polypeptide chains having a net formal charge of zero prior to dispensing the slurry solution.

18. The method of claim 14, further comprising after removing the excess material, introducing a first cleaning solution at a third pH value to the first polishing pad, wherein the third pH value induces an electrostatic repulsion between the first abrasives and the first polypeptide chains to detach the first abrasives from the first polypeptide chains.

19. The method of claim 18, further comprising after buffing the workpiece, introducing a second cleaning solution at a fourth pH value to the second polishing pad, wherein the fourth pH value induces an electrostatic repulsion between the second abrasives and the second polypeptide chains to detach the second abrasives from the second polypeptide chains.

20. The method of claim 14, further comprising after introducing a cleaning solution, applying an enzymatic solution to the polishing pad to cleave peptide residues from the polypeptide chains.

* * * * *